US008560279B2

(12) United States Patent
Callan

(10) Patent No.: US 8,560,279 B2
(45) Date of Patent: Oct. 15, 2013

(54) METHOD OF DETERMINING THE INFLUENCE OF A VARIABLE IN A PHENOMENON

(75) Inventor: Robert Edward Callan, Eastleigh (GB)

(73) Assignee: General Electric Company, Schenectady, NY (US)

( * ) Notice: Subject to any disclaimer, the term of this patent is extended or adjusted under 35 U.S.C. 154(b) by 268 days.

(21) Appl. No.: 13/023,181

(22) Filed: Feb. 8, 2011

(65) Prior Publication Data

US 2012/0203517 A1 Aug. 9, 2012

(51) Int. Cl.
*G06F 17/50* (2006.01)
(52) U.S. Cl.
USPC .............................................................. 703/2
(58) Field of Classification Search
USPC ................ 703/2; 434/277–282; 345/419–420
See application file for complete search history.

(56) References Cited

U.S. PATENT DOCUMENTS

| | | | | |
|---|---|---|---|---|
| 6,671,661 | B1 * | 12/2003 | Bishop | 703/2 |
| 7,519,564 | B2 * | 4/2009 | Horvitz | 706/12 |
| 7,636,651 | B2 * | 12/2009 | Bishop et al. | 703/2 |
| 8,306,791 | B2 * | 11/2012 | Yerramalla et al. | 703/2 |
| 2006/0106743 | A1 * | 5/2006 | Horvitz | 706/21 |
| 2008/0177513 | A1 * | 7/2008 | Miller | 703/2 |
| 2009/0144218 | A1 | 6/2009 | Bonawitz et al. | |
| 2012/0123756 | A1 * | 5/2012 | Wang et al. | 703/2 |
| 2012/0203517 | A1 * | 8/2012 | Callan | 703/2 |

OTHER PUBLICATIONS

"Graphical models for statistical inference and data assimilation," by Alexander T. Ihler, Sergey Kirshner, Michael Ghil, Andrew W. Roberston, Padhraic Smyth, 2006 Elsevier.*
"Adaptive On-Wing Gas Turine Engine Performance Estimation," Rob Luppold & Tom Brotherton, Al Volponi, 2007 IEEE.*
Search Report and Written Opinion from corresponding EP Application No. 12154062.9, dated Jul. 31, 2012.
Ihler et al, "Graphical models for statistical inference and data assimilation", Physica D. North-Holland, Amersterdam, NL, vol. 230, No. 1-2, XP022093083, May 23, 2007, pp. 72-87.
Luppold R et al, "Adaptive On-Wing Gas Turbine Engine Performance Estimation", Aerospace Conference, XP031214353, Mar. 3, 2007, pp. 1-12.

* cited by examiner

*Primary Examiner* — Omar Fernandez Rivas
*Assistant Examiner* — Maryam Ipakchi
(74) *Attorney, Agent, or Firm* — McGarry Bair PC

(57) ABSTRACT

A method of determining the influence of a variable in a phenomenon includes extracting a selected variable for analysis and conducting a sequence of graphical operations that includes other variables in the phenomenon. Calculating a variable influence indicator for the selected variable and repeating the steps for other selected variables enables an evaluation among the selected variables to determine their influence in the phenomenon.

8 Claims, 5 Drawing Sheets

METHOD OF DETERMINING THE INFLUENCE OF A VARIABLE IN A PHENOMENON

BACKGROUND OF THE INVENTION

The technology described herein relates to a method of determining the influence of a given variable in a phenomenon.

Detecting patterns that relate to particular diseases or failure modes in machines or observed events can be very challenging. It is generally easier to determine when symptoms (or measurements) are abnormal. Knowing that a situation is abnormal can be quite valuable. However, there is even more value if the abnormality can be tagged with a severity rating and/or associated with a specific condition or failure mode. Diagnostic information is contained in the pattern of association between input variables (e.g. measurement parameters) and anomaly. However, this pattern can be very difficult to extract.

Within the process industry, Principal Component Analysis (PCA) is often used for anomaly detection or fault diagnosis. Variable contributions to the residual or principal components can be calculated. This method provides an indication of which variables contribute most to the measure of abnormality. However, PCA has restrictions. It is uni-modal, meaning that its utility is limited when data are generated from complex densities and it does not provide an intuitive method for handling missing data.

Another approach for detecting the contribution of variables is to calculate residuals. For a specific variable, a regression technique is used to predict the variable's value which is then subtracted from the measured value to derive the residual. The magnitude of the residual provides a measure of its contribution to an anomalous state. However, it can still be difficult to directly compare different variables. And, if multiple variables are contributing to the anomaly, the outputs from the residuals can be misleading. The regression technique is often uni-modal and will suffer similar restrictions to PCA.

BRIEF DESCRIPTION OF THE INVENTION

In one aspect, a method of determining the influence of a variable in a phenomenon comprises providing a mixture model in graphical form including model components, at least one class node representing a class associated with the model components, and a plurality of variable nodes representing values associated with variables within the class, all representing physical data within a system experiencing the phenomenon, selecting one or a subset of the variable nodes, performing an operation on the graphical form by setting evidence on the variable nodes other than the selected one, calculating a joint distribution for the selected variable node and one or more class nodes by marginalizing to generate a new graph, calculating a variable influence indicator for the selected variable node from the new graph, repeating the selecting, performing and calculating steps for other selected variable nodes, and evaluating the magnitude of the variable influence indicators for the variable nodes relative to each other.

In another aspect, the new graph is a transformation described by $f: P(X_1, I|e_{X-Xj}, e_S) \rightarrow P(X'_1, I')$, where I represents the model components, X represents the variables, S represents states or distributions over a class, and e denotes evidence.

In a further aspect, the variable influence indicator represents a directional change in the values of the variable node. As well, the selecting can be application dependent. Further, the performing step can include setting evidence by pattern and by sequencing to determine the type of variable influence indicator. In one embodiment, the phenomenon occurs in the system of an aircraft engine and the mixture model represents performance of the aircraft engine.

DETAILED DESCRIPTION

Figure 1A:
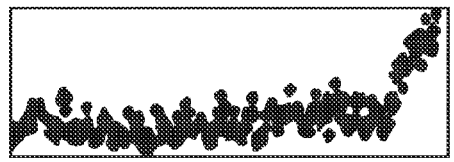
FIG. 1A shows data plots for several different input variables in a given phenomenon.
Figure 1A:
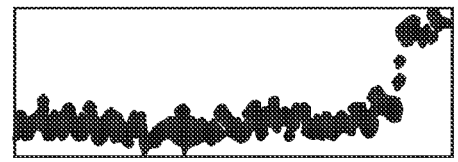
Figure 1A:
Figure 1A:
Figure 1A:
Figure 1A:
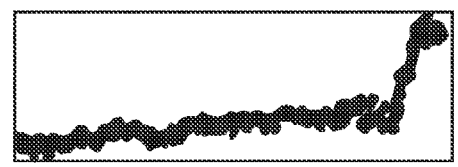
Figure 1A:
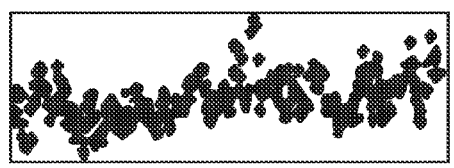
Figure 1A:

In the following description, for the purposes of explanation, numerous specific details are set forth in order to provide a thorough understanding of the technology described herein. It will be evident to one skilled in the art, however, that the exemplary embodiments may be practiced without these specific details. In other instances, structures and device are shown in diagram form in order to facilitate description of the exemplary embodiments.

The exemplary embodiments are described below with reference to the drawings. These drawings illustrate certain details of specific embodiments that implement the module, method, and computer program product described herein. However, the drawings should not be construed as imposing any limitations that may be present in the drawings. The method and computer program product may be provided on any machine-readable media for accomplishing their operations. The embodiments may be implemented using an existing computer processor, or by a special purpose computer processor incorporated for this or another purpose, or by a hardwired system.

As noted above, embodiments described herein include a computer program product comprising non-transitory, machine-readable media for carrying or having machine-executable instructions or data structures stored thereon. Such machine-readable media can be any available media, which can be accessed by a general purpose or special purpose computer or other machine with a processor. By way of example, such machine-readable media can comprise RAM, ROM, EPROM, EEPROM, CD-ROM or other optical disk storage, magnetic disk storage or other magnetic storage devices, or any other medium that can be used to carry or store desired program code in the form of machine-executable instructions or data structures and that can be accessed by a general purpose or special purpose computer or other machine with a processor. When information is transferred or provided over a network or another communication connection (either hardwired, wireless, or a combination of hardwired or wireless) to a machine, the machine properly views the connection as a machine-readable medium. Thus, any such a connection is properly termed a machine-readable medium. Combinations of the above are also included within the scope of machine-readable media. Machine-executable instructions comprise, for example, instructions and data, which cause a general purpose computer, special purpose computer, or special purpose processing machines to perform a certain function or group of functions.

Embodiments will be described in the general context of method steps that may be implemented in one embodiment by a program product including machine-executable instructions, such as program code, for example, in the form of program modules executed by machines in networked environments. Generally, program modules include routines, programs, objects, components, data structures, etc. that have the technical effect of performing particular tasks or implementing particular abstract data types. Machine-executable instructions, associated data structures, and program modules represent examples of program code for executing steps of the method disclosed herein. The particular sequence of such executable instructions or associated data structures represent examples of corresponding acts for implementing the functions described in such steps.

Embodiments may be practiced in a networked environment using logical connections to one or more remote computers having processors. Logical connections may include a local area network (LAN) and a wide area network (WAN) that are presented here by way of example and not limitation. Such networking environments are commonplace in office-wide or enterprise-wide computer networks, intranets and the internet and may use a wide variety of different communication protocols. Those skilled in the art will appreciate that such network computing environments will typically encompass many types of computer system configuration, including personal computers, hand-held devices, multiprocessor systems, microprocessor-based or programmable consumer electronics, network PCs, minicomputers, mainframe computers, and the like.

Embodiments may also be practiced in distributed computing environments where tasks are performed by local and remote processing devices that are linked (either by hardwired links, wireless links, or by a combination of hardwired or wireless links) through a communication network. In a distributed computing environment, program modules may be located in both local and remote memory storage devices.

An exemplary system for implementing the overall or portions of the exemplary embodiments might include a general purpose computing device in the form of a computer, including a processing unit, a system memory, and a system bus, that couples various system components including the system memory to the processing unit. The system memory may include read only memory (ROM) and random access memory (RAM). The computer may also include a magnetic hard disk drive for reading from and writing to a magnetic hard disk, a magnetic disk drive for reading from or writing to a removable magnetic disk, and an optical disk drive for reading from or writing to a removable optical disk such as a CD-ROM or other optical media. The drives and their associated machine-readable media provide nonvolatile storage of machine-executable instructions, data structures, program modules and other data for the computer.

Technical effects of the method disclosed in the embodiments include more efficiently detecting patterns that relate to particular diseases or failure modes in machines, reducing diagnosing and troubleshooting time and allowing better health and maintenance planning.

Variable Influence Indicators are used to give an indication of a variable's 'interesting' behavior. An example application of Variable Influence Indicators is determining which variables are responsible for abnormal behavior. Variable Influence Indicators are calculated using a type of data driven built model known as a mixture model. It is assumed that this model has been trained using historical data in a way to highlight behavior of interest to a specific application. Mixture models provide a rich resource for modeling a broad range of physical phenomena as described by G. McLachlan and D. Peel in *Finite Mixture Models*, John Wiley & Sons, (2000). Mixture models can be used to model normal behavior in a phenomenon and, thereby, also to detect abnormal behavior. The likelihood score from a mixture model can be used to monitor abnormal behavior. In essence, a Variable Influence Indicator is a likelihood score.

Interesting behavior in this context means that a variable resides in a region of space that sits on the edge of a mixture model's density. The model is more sensitive to data that reside in these regions. For many applications, such as health monitoring, regions of low density space often represent the regions of most interest because machines operating in these regions are functioning outside of their designed limits.

Figure 1B:
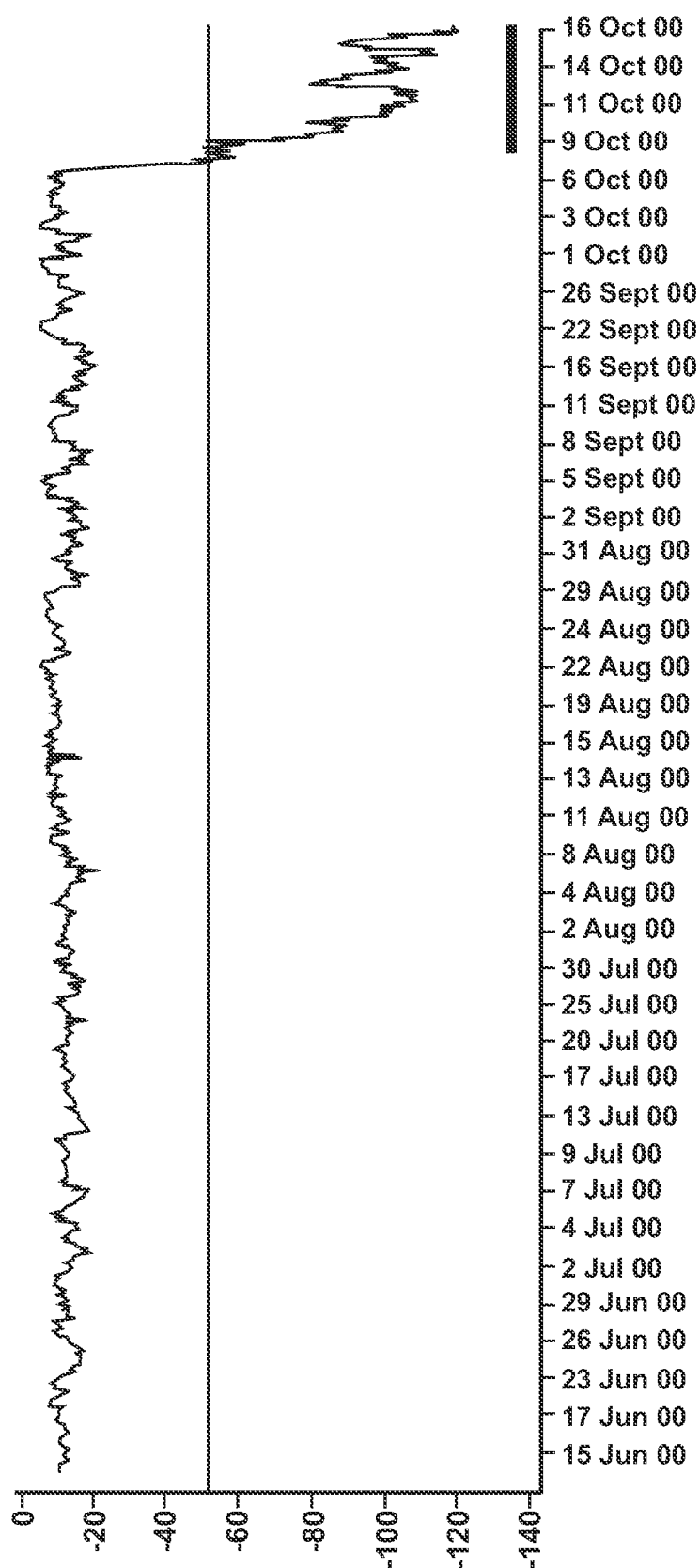
FIG. 1B is a likelihood score for a time history of the input variables in FIG. 1A.

Likelihood scores can provide useful diagnostic information when data transition through regions of low density. Likelihoods will often reveal trend characteristics that provide information about behavior (such as health is deteriorating, or sensing appears random and possibly associated with poor instrumentation). This is illustrated in FIGS. 1A and 1B. FIG. 1A shows data plots of the values of eight different variables in a given phenomenon. FIG. 1B is a time history plot of the likelihood score for all of the input variables in FIG. 1A. Here we see that the likelihood for the complete data mirrors the shape of several input variables—it provides a form of fusion and summarizes behavior over all input variables (note that likelihood is always shown in log space). If the complete history for all input variables resided in high density regions there would be no shape (downward trend) in the likelihood score. Also, the magnitude of the likelihood score depends on the number of abnormally behaving input variables.

The likelihood score reveals that the mixture model has little experience of the data operating at levels associated with the final part of the data's time history. If the mixture model were trained to represent normal behavior, the likelihood score would be revealing increasingly anomalous behavior. However, although the likelihood score shows abnormal behavior it does not show which combination of input variables are behaving abnormally. Furthermore, it is not easy to derive this information when working directly with the input variables. This is because the scales and statistical nature of these input variables can differ significantly. Variable Influence Indicators can reveal which variables are contributing significantly to an anomaly.

Although Variable Influence Indicators are log likelihood scores, they are calculated in a specific way to reveal information. This means that the mixture model has to be generated in a way to reveal interesting behavior. This is conveniently explained when describing a mixture model in Graphical Form.

Figure 2:
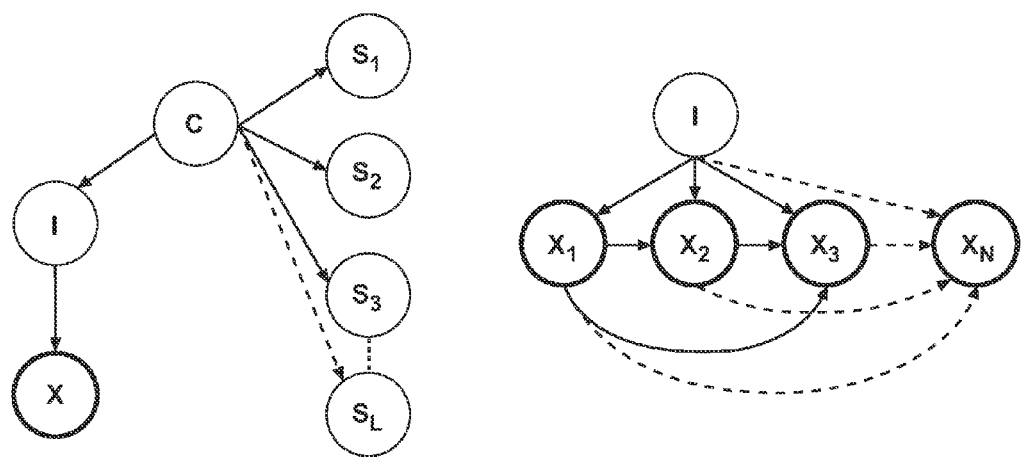
FIG. 2 is a mixture model of a phenomenon showing both a Gaussian distribution and discrete nodes that act as filters.
Figure 3:
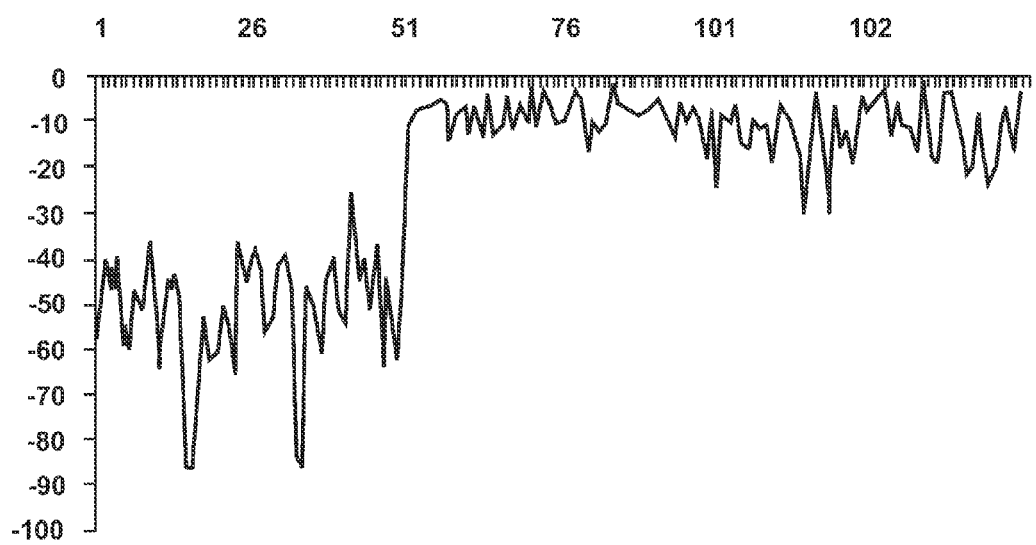
FIG. 3 is an exemplary log likelihood of a model based on the Iris data.

A standard mixture model has Gaussian distributions connected to a discrete parent node representing the mixture components (also known sometimes as "clusters"). This is illustrated in FIG. 2. In one embodiment of the invention, the model for calculating Variable Influence Indicators contains additional nodes that act as filters. These nodes are often discrete but can be continuous. These filters can be set to change the mixing weights of the model components when performing predictions. If, for example, different components (or combinations of components) are associated with individual classes, and the class of a case is known, it would be possible to remove representation of the current class and get a view on the current case from the perspective of all other classes. A specific example showing the effect of such filtering on a likelihood score is shown in FIG. 3. This is from a model built on the well-known Iris flower data set—a simple data set comprising a set of sepal and petal measurements from three species of Iris with 50 cases in each species. A log likelihood using all input variables is shown for each species. Predictions are performed using a filter that ensures components associated with the current species are not used in calculations. This type of prediction can indicate which of the species (if any) is most different. FIG. 3 shows the species to be *Setosa* which for simple data such as these can easily be confirmed by plotting scatter charts (the likelihood scores are ordered by species with *Setosa* plotted first followed by *Versicolor* then *Virginica*).

In FIG. 2, I represents model components and X is a multivariate Gaussian comprising $X_1, X_2, X_3 \ldots X_N$. Node C represents a class variable. In one embodiment, the nodes $S_L$ denote variable values within the class (i.e. individual classes). Node C has a number of states, equivalent to the number of classes (one state for each $S_L$). The distribution of each $S_L$ is typically binary and encoded in a manner that all other classes remain active when the current class (corresponding to $S_L$) is deactivated (i.e., removed from model predictions). The distribution can also be encoded to perform the inverse of this filtering. In another embodiment the nodes $S_L$ could be continuous nodes, each one encoding a form of 'soft' evidence over the values of node C.

Figure 4:
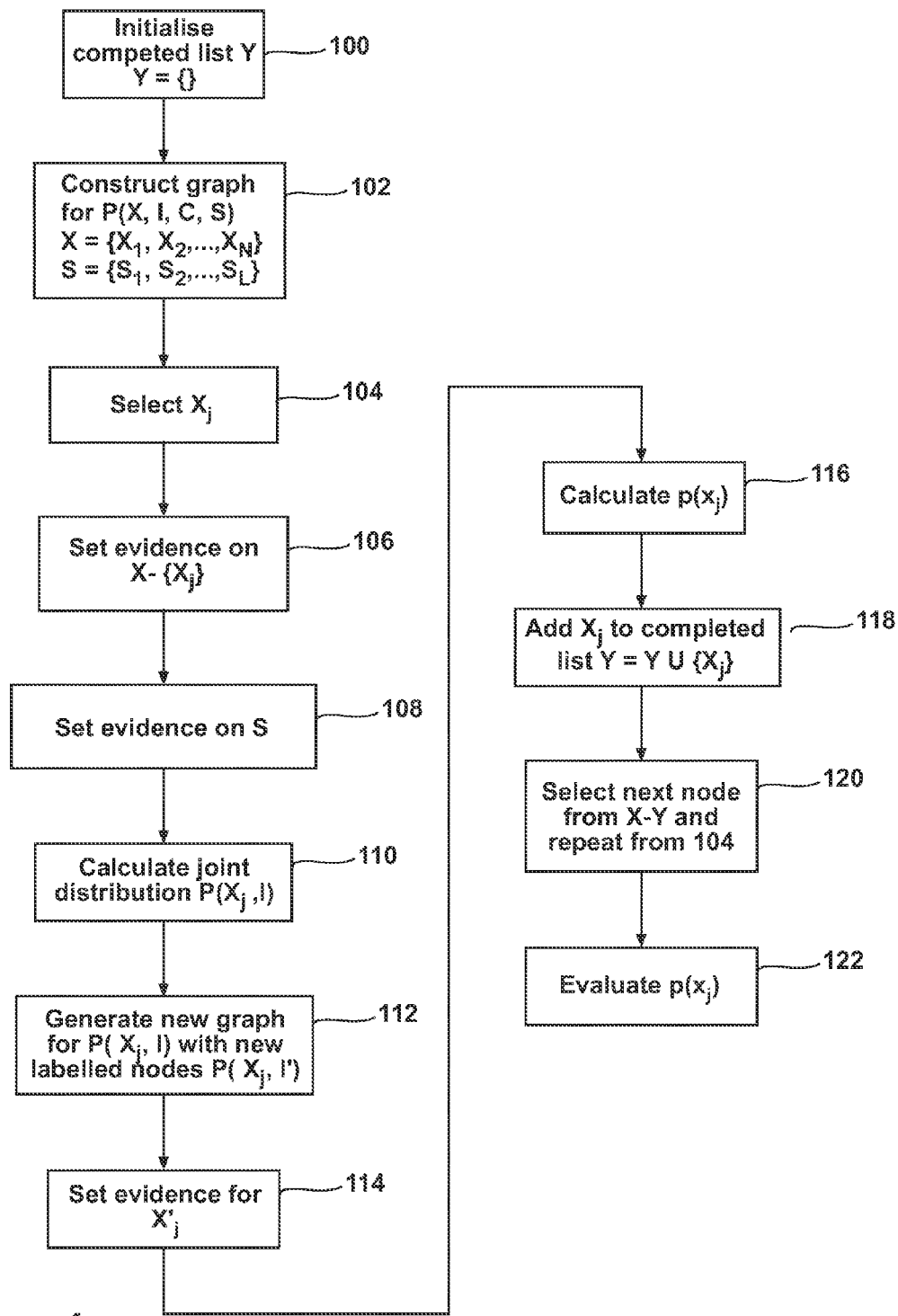
FIG. 4 is a flow chart depicting a method of determining the influence of a variable in a phenomenon according to one embodiment of the present invention.

An exemplary flow chart of a method for evaluating Variable Influence Indicators using a mixture model such as that illustrated in FIG. 2 is shown in FIG. 4. In this method, a Variable Influence Indicator can be calculated using graphical transformations and inference. A transformation is an operation on a graph structure that results in a new graph structure. Inference involves entering evidence (assigning values to one or more nodes) and calculating joint probabilities or individual node probabilities. Different transformation and inference steps give different variants of Variable Influence Indicators that reveal different behavior traits. For example, consider a model of an aircraft engine's behavior. The exhaust gas temperature will have normal regions of operation for a particular phase in flight and a very high or very low value might signal abnormal behavior. One type of Variable Influence Indicator can be used to monitor this 'out of range' abnormal behavior. Another type of Variable Influence Indicator can be used to monitor a different pattern of abnormal behavior when there is correlation between measurement parameters (such as fuel flow and the low pressure spool speed). While individual measurements might be within normal range, the pattern across parameters can be abnormal (e.g., when there is a loss of correlation).

In FIG. 4, a list Y is initialized to be empty at 100. This list will keep a track of measurement nodes that have been processed. A mixture model such as described in FIG. 2 is defined graphically at 102. One of the variable nodes $X_j$ is selected at 104, and evidence is generated at 106 for all variable measurement nodes but $X_j$. Evidence is only entered when it exists and is considered valid (e.g., a measurement may be considered to be an impossible value). If required, evidence is set on variables belonging to Sat 108. The joint distribution for $X_j$ and I is then calculated at 110. A new graph is then generated at 112 containing new nodes $X'_j$ and I' encoding the joint distribution calculated at 110. An exemplary transformation for the new graph can be denoted as follows:

$$f:P(X_1,I|e_{X-Xj},e_S) \rightarrow P(X'_1,I'),$$

where I represents the model components, X represents the variables, S represents states or distributions over a class, and e denotes evidence. Evidence is set on $X'_j$ at 114 (this evidence is denoted as $x_j$) and $p(x_j)$ is calculated at 116. At 118 $X_j$ is added to the completed list Y and a new node is selected and the process repeated from 104. The log of $p(x_j)$ is the basic Variable Influence Indicator for $X_j$. As an example, consider the graph in FIG. 2. We want to calculate the Variable Influence Indicator for $X_1$ in the context of $X_2, X_3$ and $X_4$. Also, we know that this case is from class $S_2$ (in this example all nodes in S are discrete but they can be continuous or a combination of discrete and continuous). We denote the values for the case as follows:

$$X_1=x_1, X_2=x_2, X_3=x_3, X_4=x_4, \text{Class}=S_2$$

Evidence is entered and a new graph is generated at 112 by requesting the joint distribution for $(X_1, I)$:

$$f:P(X_1,I|x_2,x_3,x_4,S_2=\text{true}) \rightarrow P(X'_1,I')$$

The function $f$ refers to marginalization to generate the new graph. The superscript ' denotes a new variable with a new distribution. Marginalization is a standard method applied to graphs as taught in *Bayesian Networks and Decision Graphs*, Finn V. Jensen and Thomas D. Nielsen, Springer (2007). Instantiating the new graph enables further predictions to be performed. The basic Variable Influence Indicator for $X_1$ in this example is $$p(x_1)$$

and calculated from the new graph at 116.

The process of setting evidence determines the variant of Variable Influence Indicator produced. For example, to calculate a Variable Influence Indicator that is sensitive to out of range univariate data, the evidence on other variables is not set. However, the evidence of the other continuous variables may still be used as evidence to determine a posterior weighting on node I that is carried into the new graphical model. Furthermore, this evidence setting to calculate the posterior weighting may be iterative when nodes $X_N$ are being considered as independent. This iteration involves entering evidence for one of the evidence nodes, recording the distribution on I, repeating for all other evidence nodes and then computing the product of the recorded distributions for each state in I. Thus, in step 120, the process of selecting, generating, performing and calculating Variable Influence Indicators for other variable nodes is repeated so that their magnitudes (as plotted) can be evaluated against each other at 122 to determine the influence of the selected variable nodes. The evaluation at 122 can be automated by comparison to predetermined criteria, or it can be manual by a visual examination of the plotted distributions. We see, therefore, that there is flexibility in calculating the variant of a Variable Influence Indicator and the most suitable variant(s) is application dependent.

Variable Influence Indicators can also be signed so that they reflect the directional change in the original variable. If, for example, a measurement parameter were trending down it can be useful to have the same direction of trend in the Variable Influence Indicator. A simple way to sign a Variable Influence Indicator is to follow the same path of evidence setting to generate the new graph. The actual value (e.g., $x_1$) can then be compared with the mean value of the marginal distribution. If the value were below the mean, the Variable Influence Indicator has a negative sign and positive sign if above the mean.

Variable Influence Indicators can also be scaled relative to the fitness score and model threshold.

When the variables $X_N$ are considered as a dependent set, an abnormal variable can have a large influence on the Variable Influence Indicators of other variables. In these situations, an outer loop can be placed on the data flow shown in FIG. 4. The process in FIG. 4 is then executed to detect the variable with the largest influence. This variable is set to NULL to treat as missing and the process in FIG. 4 repeated. The process terminates when the remaining variables (i.e., those not set to NULL) have a collective likelihood score that is considered normal. In another variation of repeating the process in FIG. 4, different subsets (combinations) of variables in $X_N$ can be set to NULL. When N is small it would be possible to exhaustively run the process in FIG. 4 for all combinations of $X_N$. The definition of small N is application dependent and would be defined by considering the available computing resources, the data load and the system response time required by the application.

Figure 5:
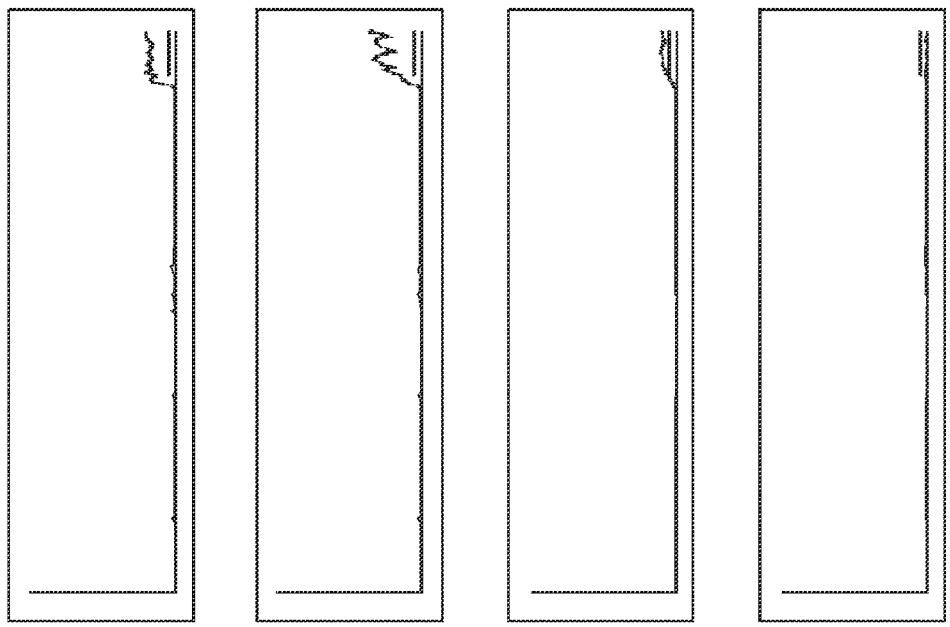
FIG. 5 is an example of variable influence indicators calculated according to the method of FIG. 4 for the data of FIG. 1A.
Figure 5:
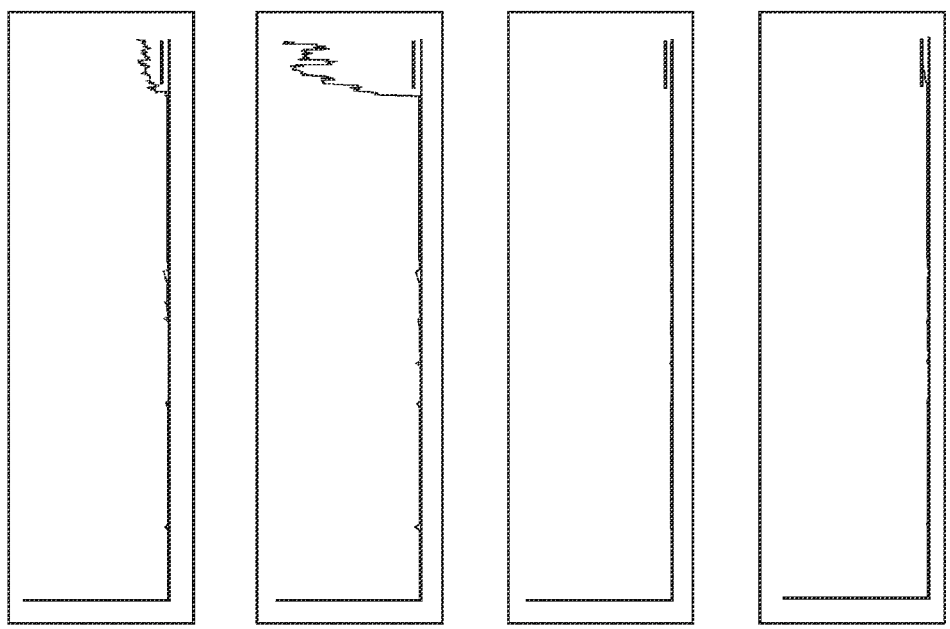

An example of Variable Influence Indicators calculated for the input data shown in FIG. 1A is shown in FIG. 5. It will be understood that different types of variable influence indicators can provide information about different types of anomalies such as univariate outliers and multivariate outliers or decorrelation. The type of variable influence indicator can be determined by the pattern of evidence entered and the sequencing of evidence entered.

This written description uses examples to disclose the invention, including the best mode, and also to enable any person skilled in the art to make and use the invention. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A method of determining the influence of a variable in a phenomenon comprising:
   providing a mixture model in graphical form, including model components, at least one class node representing a class associated with the model components, and a plurality of variable nodes, representing physical data within a system experiencing the phenomenon,
   selecting at least one of the plurality of variable nodes,
   performing an operation on the graphical form by setting evidence on the plurality of variable nodes other than the selected at least one of the plurality of variable nodes,
   calculating a joint distribution for the selected one of the plurality of variable nodes and the at least one class node by marginalizing to generate a new graph according to a transform described by $f:P(X_1,I|e_{X-Xj},e_S) \rightarrow P(X'_1,I')$, where I represents the model components, X represents the variable nodes, S represents states or distributions over a class, and e denotes the evidence,
   calculating a variable influence indicator for the selected one of the plurality of variable nodes from the new graph,
   repeating the selecting, performing and calculating steps for other selected ones of the plurality of variable nodes, and
   evaluating the magnitude of the variable influence indicators for the plurality of variable nodes relative to each other.

2. The method of claim 1 wherein the variable influence indicator represents a directional change in the values of the variable node.

3. The method of claim 1 wherein the selecting is application dependent.

4. The method of claim 1 wherein the selecting includes a subset of the plurality of variable nodes.

5. The method of claim 1 wherein the performing step includes setting evidence by pattern and by sequencing to determine a type of variable influence indicator.

6. The method of claim 1 wherein the system is an aircraft engine and the mixture model represents performance of the aircraft engine.

7. The method of claim 1 wherein the variable nodes include a plurality of first variable nodes representing continuous parameters, and a plurality of second variable nodes representing values or distributions associated with variables within the class, and wherein the selecting step includes selecting one of the first variable nodes.

8. The method of claim 1 wherein the joint distribution is calculated for the first and second variable nodes.

* * * * *